United States Patent [19]

Defretin et al.

[11] Patent Number: 4,894,862
[45] Date of Patent: Jan. 16, 1990

[54] SIGNAL COMPRESSION CIRCUIT, PARTICULARLY FOR A TELEPHONE SET

[75] Inventors: Bruno Defretin, Saint-Egreve; Thierry Arnaud, Meylan, both of France

[73] Assignee: SGS-Thomson Microelectronics S.A., Gentilly, France

[21] Appl. No.: 222,432

[22] Filed: Jul. 19, 1988

[30] Foreign Application Priority Data

Jul. 21, 1987 [FR] France ................. 87 10604

[51] Int. Cl.$^4$ ........................................... H04M 9/08
[52] U.S. Cl. ..................................... 379/390; 379/395; 330/290
[58] Field of Search ............... 379/395, 390; 330/290, 330/136

[56] References Cited

U.S. PATENT DOCUMENTS

| | | | |
|---|---|---|---|
| 3,602,648 | 12/1969 | Holtz | 179/81 A |
| 3,919,654 | 11/1975 | Toumani | 330/29 |
| 4,322,636 | 3/1982 | Schroder | 307/246 |

FOREIGN PATENT DOCUMENTS 0187696  7/1986 European Pat. Off. .

OTHER PUBLICATIONS

"CX and DNR", Elektor (Feb. 1982) Search Report.

Primary Examiner—Stafford D. Schreyer
Attorney, Agent, or Firm—Lowe, Price, LeBlanc, Becker & Shur

[57] ABSTRACT

The Invention relates to a signal compression circuit, more particularly for a telephone set of the handsfree-type, comprising a preamplifier (10), the input of which is connected with an input signal to be processed, and a preamplifier gain control device (11) for servo-controlling, to a predetermined value, the output signal amplitude of the preamplifier, in which the gain control device (11) is associated with a circuit (C, 15, 16) determining two time constants, which respectively control the increase or decrease speed of the preamplifier gain (10) in relation with the input signal amplitude (Vin).

9 Claims, 3 Drawing Sheets

SIGNAL COMPRESSION CIRCUIT, PARTICULARLY FOR A TELEPHONE SET

BACKGROUND OF THE INVENTION

The instant invention generally relates to a signal compression circuit, particularly for telephone set, comprising a preamplifier, an input of which receives a signal to be processed and a preamplifier gain control device for servo-controlling, to a predetermined value, the amplitude of the output signal of the preamplifier.

A signal compression circuit can advantageously be integrated into the emission and reception channels of a telephone set, especially of the handsfree-type, that is, the apparatus is not fitted with a handset. The function of such a circuit in this type of apparatus is to compensate for the signal losses caused either by the distance existing between the speaker and the microphone when the apparatus is in the emission mode, or by the length of the line when the apparatus is in the reception mode.

Signal compression circuits have been used especially for reducing the noise during a magnetic recording. However, those circuits have a complex structure including in particular clocks and inverter circuits. Moreover, those circuits are of large sizes, are therefore cumbersome, need relatively high power voltages due to the use of CMOS technology, use current and have a relatively high price.

As a result of those various drawbacks, the compression circuits of the aforementioned type are unsuitable for being integrated into the emission and reception channels of a handsfree telephone set.

An object of the invention is to provide for a signal compression circuit adapted to telephone technology.

Another object of the invention is to provide for such a circuit adapted to solve a specific problem which is encountered when, in the emission mode, the gain control device of the preamplifier reacts to the noise between two speech peaks: Indeed, when a speaker starts speaking, it is essential that the preamplifier may quickly respond, however, it must not respond at the same speed between two speech peaks, as for example between two syllables, in order to avoid an unwished increase of the gain and therefore of the background noise.

SUMMARY OF THE INVENTION

To achieve these objects, the invention provides for a signal compression circuit, more particularly for a telephone set of the handsfree-type, comprising a preamplifier, an input of which is connected with an input signal to be processed, and with an amplifier gain control device for servo-controlling, to a predetermined value, the amplitude of the preamplifier output signal. According to the invention, the gain control device is associated with a circuit determining two time constants, which respectively control the increase and decrease speeds of the preamplifier gain with respect to the amplitude of the input signal.

According to another embodiment of the invention, the preamplifier has a high input impedance and is so designed that the gain control device may act upon the biasing current of the preamplifier.

According to a further embodiment of the compression circuit in conformity with the invention, the preamplifier gain control device comprises a full-wave rectifier permitting to detect the peak value from the amplifier output signal and a comparator circuit for comparing this peak value with a reference value the output of the comparator circuit being connected with an external capacitor which determines the time constant of the preamplifier gain modification during a gain increase or decrease phase.

According to yet another embodiment of the invention, for determining the aforementioned time constants, as well as the variation direction of the preamplifier gain, the comparator circuit alternately connects two current sources onto the capacitor according to the result of the comparison, those two current sources respectively determining two time constants, the shorter time constant determining the gain decrease speed in response to a speech peak, and the larger time constant determining the gain increase speed of the preamplifier.

The ratio between those two time constants is set in order to avoid having an unwished increase of the preamplifier gain, and therefore of the background noise, between two speech peaks.

According to an embodiment of the invention, such a signal compression circuit is advantageously integrated into each of the emission and reception channels of a telephone set of the handsfree-type.

BRIEF DESCRIPTION OF THE DRAWINGS

Other advantages and features of the instant invention will clearly appear from the following detailed description of preferred embodiments, in connection with the attached drawings, wherein:

FIG. 1 shows the main parts of a signal compressor 1 according to the invention which, in the given example, is arranged into the emission channel of a handsfree telephone set. The drawing of this apparatus is purposely limited to a microphone M, of the electret-type and to the feeding circuit A of microphone M.

Figure 1:
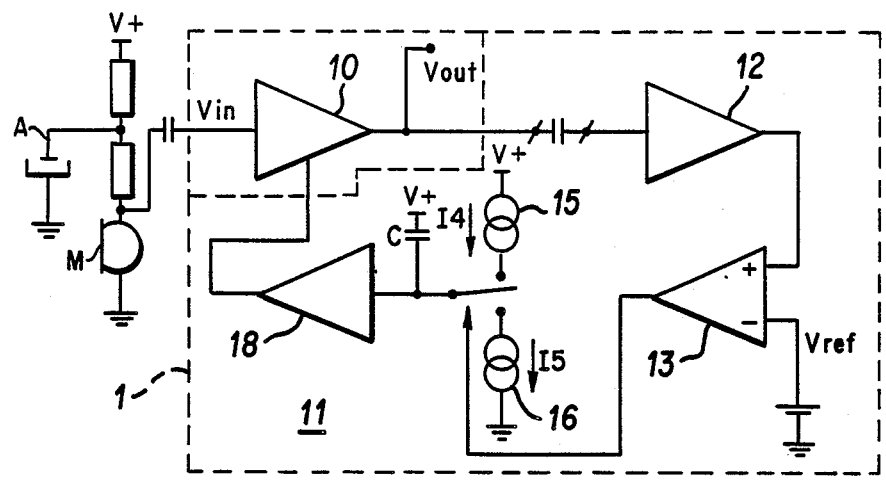
FIG. 1 is a block-diagram showing the various parts of a signal compression according to the invention for illustrating the operation principle.

The signal compressor 1 comprises a preamplifier 10 and a gain control device 11 for this preamplifier. The output terminal of microphone M is connected with the preamplifier input terminal 10, the latter having a high input impedance compatible with a microphone of the electret-type.

The output terminal of preamplifier 10 is connected with the input of a full-wave rectifier circuit 12. The output terminal of this rectifier circuit 12 is connected with an input (here, input +) of a comparator circuit 13, the other input of which (input −) is connected with a predetermined reference voltage Vref.

The output terminal of the comparator circuit 13 is connected with the control input of a switch 17 which permits to connect a terminal of the external capacitor C, either with a first current source 15 providing a charge current I4, or with a second current source 16 providing a discharge current I5. The terminal of capacitor C coupled with switch 17 is connected with the input of a voltage-current converter circuit 18, while the other terminal of capacitor C is connected with the supply voltage V+. The output terminal of the converter circuit 18 is connected with a control input of the supply or biasing current of preamplifier 10.

Figure 2:
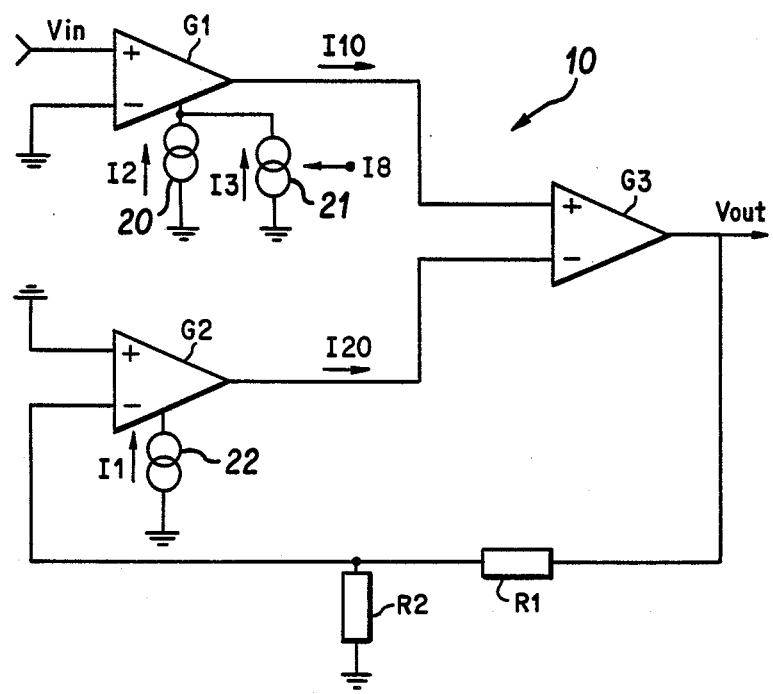
FIG. 2 is a block-diagram showing the various parts of the preamplifier of the signal compression shown in FIG. 1.
Figure 3:
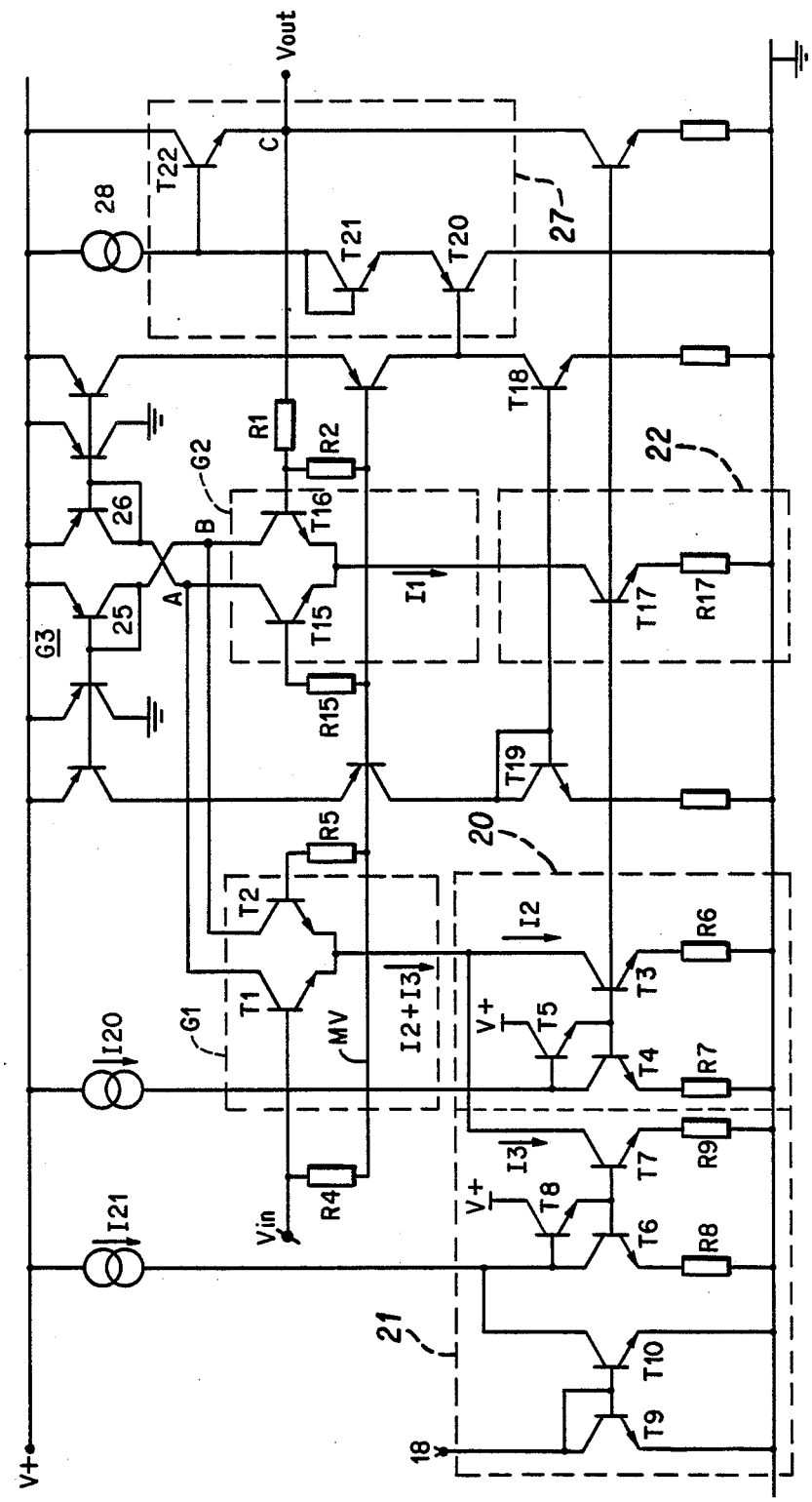
FIG. 3 is a detailed circuit diagram of an embodiment of the preamplifier shown in FIG. 2.

FIGS. 2 and 3 show in more details the structure of preamplifier 10.

As shown in FIG. 2, preamplifier 10 is constituted by three differential amplifiers G1, G2 and G3.

The differential amplifier or input amplifier G1 has one input terminal (+) connected with the output of microphone M. The other input (−) of amplifier G1 is connected with a virtual ground. The current supply of amplifier G1 is ensured by two parallel-connected current sources 20, 21. The current source 20 provides a constant current I2, while the current source 21 provides a variable current I3, determined by the output of converter 18 and ensuring the setting of the net gain of preamplifier 10. The output terminal of amplifier G1 is connected with an input terminal (+) of amplifier G3 or output amplifier. The output terminal of amplifier G3, on which is drawn the output signal Vout of preamplifier 10, is connected with an input (−) of amplifier G2 through a voltage dividing bridge constituted by two resistors R1 and R2. The other input terminal (+) of amplifier G2 is connected with a virtual ground, and its output terminal is connected with the other input (−) of output amplifier G3. The biasing terminal of amplifier G2 is connected with a current source 22 providing a constant current I1. In the same way, amplifier G3 receives a fixed bias (not shown).

The circuit in FIG. 2 operates as follows:

Let a signal Vin be transmitted by the microphone M and received at the input (+) of differential amplifier G1 of preamplifier 10. The two amplifiers G1, G2 apply on both inputs of the amplifier G3 the current signals I10 and I20 of equal value. The value of current I10 at the output of amplifier G1 is equal (subject to a factor k) to the voltage of the input signal Vin multiplied by the biasing current determined by the current sources 20 and 21, which respectively supply currents I2 and I3.

The current I10 at the output of amplifier G1 is therefore:

$$I10 = Vin \times k \times (I2 + I3).$$

The current I20 at the output of amplifier G2 is proportional to the value of the output signal voltage Vout drawn at the output of amplifier G3, multiplied by the biasing current I1 provided by the current source 22 and multiplied by a coefficient determined by the voltage dividing bridge R1, R2. The proportionality factor k is the same as above if amplifiers G1 and G2 are identical.

The output current value of amplifier G2 is therefore:

$$I20 = Vout \times k \times I1 \times (R1 + R2)/R2$$

The currents I10 and I20 tending to be equal, the preamplifier gain G is:

$$G = Vout/Vin = [(I2 + I3)/(I1)] \times [R2/R1 + R2)].$$

Currents I1 and I2 being constant currents, only the variation of current I3 provided by the servo-controlled current source 21 permits to modify the gain of preamplifier 10, so that the signal voltage at the output Vout is servo-controlled to a predetermined value set, for example, at 100 mV peak. In this way, it is possible to compensate for the signal losses due to the distance existing between the speaker of microphone M, when the apparatus is in the emission mode.

FIG. 3 shows a more detailed structure of the three amplifiers G1, G2 and G3, as well as their various electrical connections.

Amplifier G1 comprises a differential stage constituted by two transistors T1, T2. The base of transistor T1 is connected with the output terminal of microphone M, and is connected with a virtual ground Mv through a resistor R4 having a relatively high value, for example 10KΩ ("virtual ground Mv" must be construed as designating an intermediate voltage between the supply voltage V+ and the ground, for example V+/2). The emitters of transistors T1, T2 are connected with the current sources 20 and 21 extracting the current I2+I3. At the output, the collectors of transistors T1, T2 of amplifier G1 are respectively connected with terminals A and B corresponding to the outputs of amplifier G2 and to the inputs of amplifier G3.

The current source 20 is a conventional constant current source comprising a current mirror constituted by transistors T3, T4 and T5, transistor T3 being assigned to reproduce the current flowing through transistor T4. Transistor T4, in series with a resistor R7, receives the current from a current source I20. Therefore, to ensure a threshold bias of amplifier G1, a predetermined constant current I2 flows through transistor T3 serially connected with a resistor R6.

The variable current source 21 also comprises a current mirror constituted by transistors T6, T7, T8 and by resistors R8, R9. Thus, the current flowing in resistor R8 from a current source I21 is reproduced in resistor R9 for supplying a current I3. This current I3 is adjustable due to the fact a portion of the current from the current source I21 can be derived into a transistor T10 connected as a current mirror with a transistor T9. The current flowing in transistor T9 is the current supplied at the output by the voltage-current converter 18 shown in FIG. 1 and which constitutes the last component of the regulation loop associated with preamplifier 10.

Amplifier G2 comprises a differential stage constituted by transistors T15, T16, and is associated with the constant current source 22 shown in FIG. 2. The base of transistor T15 is connected with the virtual ground through a resistor R15. The base of transistor T16 is connected with the output Vout of amplifier G3 through the dividing bridge shown in FIG. 2 constituted by resistors R1, R2. The emitters of transistors T15, T16, are connected with the current source 22 comprising transistor T17 and resistor R17. The base of transistor T17 is connected to the base of transistors T3 and T4. The constant current source 22 therefore provides a current I1 equal or proportional to current I2 provided by the constant current source 20. As previously noted, amplifier G2 is preferentially identical to amplifier G1.

At the output, the collectors of transistors T15, T16 are respectively connected with points A, B corresponding to the input terminals + and − of amplifier G3.

The elements corresponding to amplifier G3 are not surrounded by dotted lines since it includes numerous components located on the figure on the right side of diagrams G1 and 20 with the exception of blocks G2 and 22.

Amplifier G3 comprises two current input stages 25, 26 respectively constituted by two current mirror circuits, and an output stage 27. Both outputs of circuits 25, 26 are respectively connected with two transistors T18, T19 connected by their bases, transistor T18 being diode-connected, and those two transistors constituting an active load.

The output stage 27 of amplifier G3 is constituted by three transistors T20, T21 and T22. The base of transistor T20 is connected with the collector of transistor T18, its collector is grounded, and its emitter is connected with a current source 28 through a diode-connected transistor T21. The base of transistor T22 is connected with the transistor collector T21, its collector is connected with a supply voltage V+, the output signal being drawn on its emitter at a terminal C which is also connected with the input of amplifier G2 through the aforementioned dividing bridge R1, R2.

Figure 4:
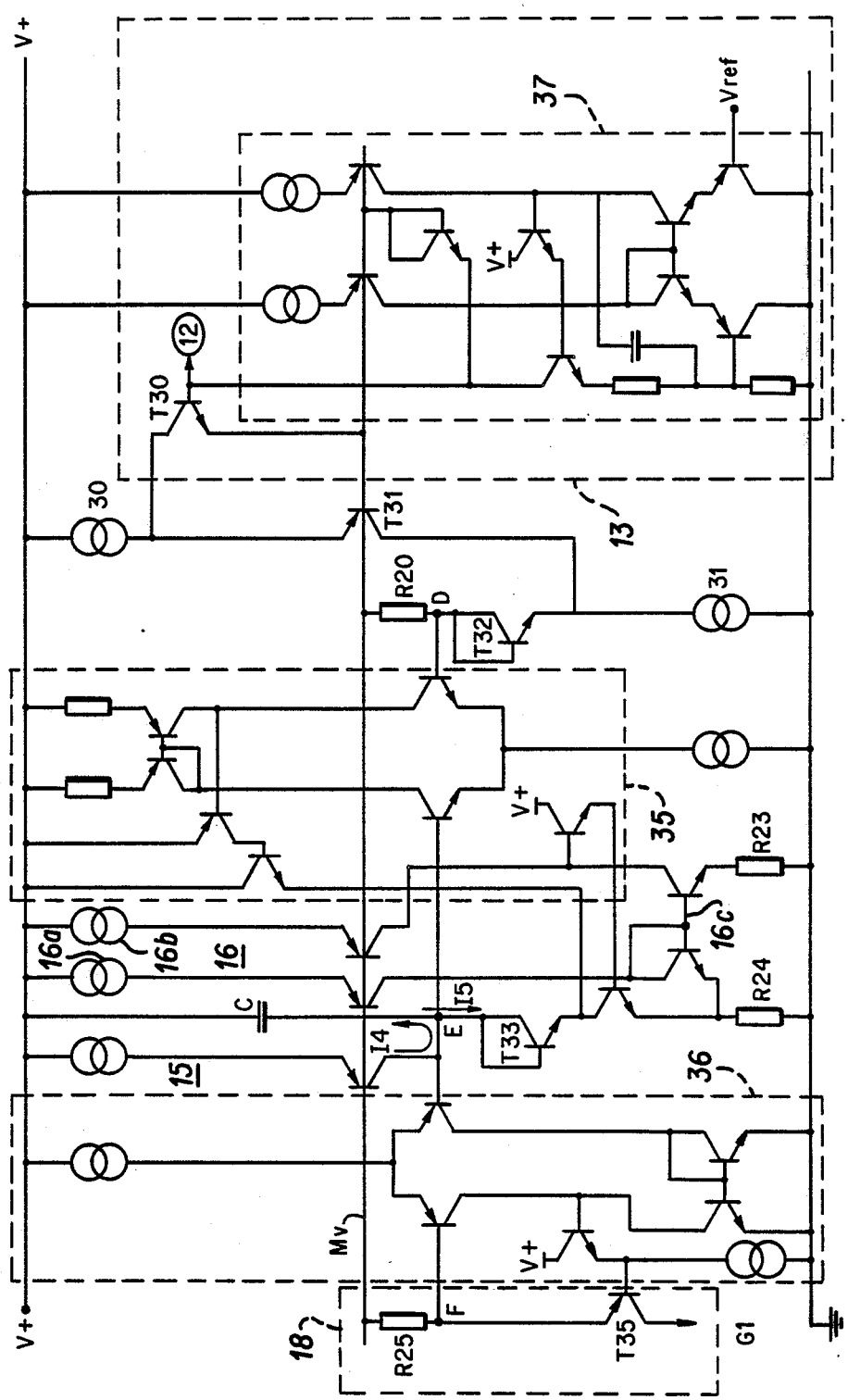
FIG. 4 is a detailed circuit diagram of an embodiment of a portion of the gain control circuit shown in FIG. 1.

FIG. 4 shows a detailed embodiment of the components included between the inputs of comparator 13 and the output of the voltage-current converter circuit 18.

In FIG. 4, reference 13 designates the comparator, references 15 and 16 designate the current sources, reference C designates a capacitor and reference 18 designates the voltage-current inverter, as in FIG. 1. Reference 17 designating the switch shown in FIG. 1 is not visible in FIG. 4 since, as it will be later disclosed, its function is distributed among several components.

Comparator circuit 13 is mainly constituted by a transistor T30, the base of which is connected with the output of the rectifying circuit 12 shown in FIG. 1 and with the output of a circuit 37 which converts the reference voltage Vref into a current. The OFF and ON states of transistor T30 determine the switching function of the switch 17 shown in FIG. 1. The emitter of transistor T30 is connected with the virtual ground Mv and its collector is connected, on the other hand, with a constant current source 30 connected with voltage V+ and, on the other hand, with another constant current source 31 connected with the ground through a transistor T31. The emitter of a diode-connected transistor T32 is connected with the current source 31, and its collector is connected with a terminal of a resistor R20, the other terminal of which is connected with the virtual ground.

The operation of this circuit 13 is as follows.

The current applied on the base of transistor T30 shown in FIG. 4 is equal to the difference in the currents resulting from the transformations into currents of the output signals from preamplifier 10 and of the reference voltage Vref, respectively. In practice, the conventional rectifying circuit 12 is, in the given example, a circuit that provides at its output a current signal proportional to the peak value of the voltage output signal Vout. That is the reason why the reference voltage Vref has also to be transformed into a current signal by the circuit 37 shown in FIG. 4.

If the current difference applied on the base of transistor T30 is null or negative, transistor T30 is blocked. In that case, the current source 31, 10microamperes for example, absorbs the current of source 30, which is a saturable current source. Under those conditions, there is no current flowing through resistor R20 and the voltage applied at terminal D of resistor R20 is that of the virtual ground.

If the current difference on the base of transistor T30 becomes positive, the current source 30 is at least partially derived towards the virtual ground by flowing through transistor T30 which becomes conductive. Thus, the current source 31 extracts, on the one hand, a portion of the current provided by source 30 if the latter is not completely derived, and, on the other hand, causes the current to flow through resistor R20 and the voltage on terminal D of resistor R20 drops.

An amplifier-follower 35 (not shown in FIG. 1) is used to transmit the voltage from said terminal D to a terminal E connected with capacitor C, the other terminal of which is connected with the supply voltage V+. The function of this amplifier-follower is to transfer the voltage present at the terminals of resistor R20 to the terminals of capacitor C (with a given delay as disclosed hereinafter). The output of amplifier 35 is connected at the junction between resistor R20 and the collector of transistor T32, and its output is connected with terminal E of capacitor C through a diode-connected transistor T33.

As previously disclosed with reference to FIG. 1, the capacitor is associated with two current sources 15, 16. The current source 15 is designed to slowly discharge capacitor 6, according to a current I4, is set between the supply voltage V+ and terminal E of capacitor C connected with the output of amplifier-follower 35. Current I4 is, for example, equal to 1 microampere. The current source 16 designed to quickly charge capacitor C according to a current I5 is, in the given example, constituted by two current sources 16a, 16b supplying equal currents, having a value of 1 microampere for example, which are multiplied by a coefficient k1, equal to 100, by an auxiliary circuit 16c. Said circuit 16c more particularly comprises two resistors R23, R24 in a ratio of 100 for providing a current I5 of 100 microamperes. The ratio between the charge and discharge speeds is thus, in the given example, equal to 100.

Another amplifier-follower 36 is connected between terminal E of capacitor C and a terminal F of an output stage 18 which constitutes the voltage-current converter shown in FIG. 1, said output stage comprising a resistor R25 and an output transistor T35 interconnected at terminal F. The function of amplifier-follower 36 is to transfer the voltage at terminal E of capacitor C, onto terminal F of resistor R25. The voltage at the terminals of resistor 25 will generate a variable output current, which will permit to vary the gain of preamplifier 10.

The way the voltage variations on terminal D of resistor R20 are reflected towards terminals E and F then towards the variable current source 13 will now be discussed.

When there is no current flowing through resistor R20, terminal D has the same voltage as the virtual ground. Then, capacitor C slowly discharges under the influence of current source 15 according to current 14 determined at a value of 1 microampere for example. The discharge of capacitor C causes a voltage decrease at terminal F of resistor R25, and therefore a current decrease in the emitter of output transistor T35. Said current decrease is reflected by the variable current source 21 to result in an increase of current 13 (FIGS. 2, 3) and therefore in an increase of the gain of amplifier G1 and an increase of the value of output signal Vout, in order to tend to take back the peak value of this output signal at the reference voltage Vref, determined for example at 100 mV.

As capacitor C slowly discharges through source 15, a slow increase of the gain of amplifier G1 is obtained. Thus, the signal compressor 1 according to the invention permits to avoid any undesired increase of the background noise that surrounds the speaker, especially between two syllables of a word.

When a current flows through resistor R20 and when the voltage at point D decreases, this variation is transmitted by the amplifier-follower 35 to the terminals of capacitor C, and causes the charging thereof through the current source 16 determined for example at 100 microamperes. The quick charge of capacitor C causes a voltage increase at terminal F of resistor R25. Under those conditions, less current is extracted from the emitters of the differential stage T1, T2 of amplifier G1, which causes a gain decrease of said amplifier and the output signal Vout of the amplifier 10 tends to be reduced to a peak value of 100 mV. It is essential that capacitor C may be quickly charged in order to obtain a quick gain decrease of preamplifier 10, said quick gain decrease occurring in particular when the speaker starts speaking.

In the given example, the gain of preamplifier 10 varies between 12 and 38 dB for an input impedance of 10KΩ. For an output signal range of 100 mV peak, the compressor 1 servo-controls the output signal Vout to 100 mV peak for an input signal Vin varying in a range of 1.25 mV to 25 mV peak. For input signals Vin lower than 1.25 mV peak, the gain of preamplifier 1 is constant and equal to 38 dB, while for input signals Vin higher than 25 mV peak, the gain of the preamplifier is constant and equal to 12 dB.

Advantageously, the circuits constituting the signal converter are carried out in the bipolar technology, which permits to use a supply voltage of 2.5 V compatible with the telephone technology.

Of course, the instant invention is not limited to the aforementioned embodiment and includes all the variations which will appear to those skilled in the art. Furthermore, the signal compressor in accordance with the invention can be used in other fields than those of the telephone technology.

We claim:

1. A signal compression circuit for a handsfree-type telephone set, comprising:
    a preamplifier, having an input for receiving an input signal to be processed; and
    a preamplifier gain control device for servo-controlling, to a predetermined value, the amplitude of an output signal supplied by said preamplifier, wherein said gain control device is responsive to a voltage across a capacitor of a circuit including said capacitor and first and second current sources, said circuit for determining two time constants which respectively control rise time and fall time of the preamplifier gain in response to the amplitude of said input signal,
    said gain control device including a rectifying circuit for extracting an instantaneous peak value of said output signal of said preamplifier, a comparator circuit for comparing said instantaneous peak value with a reference value corresponding to said predetermined value, and, in response to said comparison, selectively connecting one of said current sources across said capacitor.

2. A compression circuit according to claim 1, further comprising a voltage-current converting circuit for transforming a voltage at the terminals of said capacitor into a biasing current of the preamplifier for controlling the gain thereof.

3. A compression circuit according to claim 1, wherein the rectifying circuit provides an output current signal, and wherein the reference value is transformed into a current signal by a converter circuit.

4. A compression circuit according to claim 1, wherein discharge and charge time constants of said capacitor have a ratio substantially greater than unity.

5. A compression circuit according to claim 1, wherein said ratio is substantially equal to 100.

6. A compression circuit according to claim 1, wherein the preamplifier comprises:
    a first amplifier for receiving the input signal;
    a second amplifier for receiving the output signal; and
    a third amplifier receiving output signals from the first and second amplifiers;
    wherein the gain of the first amplifier is responsive to a variable biasing source controlled by the output of the gain control circuit.

7. A handsfree-type telephone set comprising emission and reception channels, each of said channels including a signal compressor having (a) a preamplifier having an input for receiving an input signal to be processed and (b) a preamplifier gain control device for controlling, to a predetermined value, the amplitude of an output signal supplied by said preamplifier, wherein said gain control device is responsive to a circuit for determining two time constants which respectively control rise time and fall time of the preamplifier gain in response to the amplitude of said input signal.

8. A signal compression circuit for use with a telephone instrument, comprising:
    a preamplifier, having an input for receiving an input signal to be processed and providing an output signal corresponding to said input signal amplified by a gain responsive to a control signal; and
    gain control means for supplying said control signal to said preamplifier for controlling the gain thereof, said gain control means adjusting said output signal to obtain a predetermined output signal amplitude, said gain control means including
        (a) rectification means responsive to said output signal for supplying a peak value signal of said output signal of said preamplifier,
        (b) a source of a predetermined reference potential,
        (c) comparator means for comparing said peak value signal with said predetermined reference potential and, in response, generating a binary decision signal,
        (d) ramp signal generating means for generating said control signal, said control signal selectively comprising, in response to said binary decision signal, first and second ramp signals having respective positive and negative slopes.

9. A compression circuit according to claim 8, wherein said ramp signals generating means includes a capacitor for storing an electric charge, first current source means for supplying a predetermined d.c. charging current, second current source for supplying a predetermined d.c. discharging current, switching means responsive to said binary decision signal for selectively applying said charging and discharging currents, respectively, to said capacitor for charging and discharging said capacitor, and means for generating said control signal in response to a voltage across said capacitor.

* * * * *